United States Patent [19]

Waldron

[11] 4,096,430

[45] Jun. 20, 1978

[54] METAL-OXIDE-SEMICONDUCTOR VOLTAGE REFERENCE

[75] Inventor: Wesley K. Waldron, Scotia, N.Y.

[73] Assignee: General Electric Company, Schenectady, N.Y.

[21] Appl. No.: 783,965

[22] Filed: Apr. 4, 1977

[51] Int. Cl.[2] .......... G05F 1/60; H03K 5/20

[52] U.S. Cl. .......... 323/22 R; 307/297; 307/304; 357/42

[58] Field of Search .......... 307/297, 304; 323/1, 323/4, 16, 22 R; 357/42

[56] References Cited

U.S. PATENT DOCUMENTS

| | | | |
|---|---|---|---|
| 3,743,923 | 7/1973 | Steudel | 323/22 R |
| 3,757,200 | 9/1973 | Cohen | 323/22 R |
| 3,806,742 | 4/1974 | Powell | 307/297 |
| 3,823,332 | 7/1974 | Feryszka et al. | 307/297 |
| 3,943,380 | 3/1976 | Morgan et al. | 323/22 R |
| 4,047,059 | 9/1977 | Rosenthal | 307/304 |

*Primary Examiner*—Gerald Goldberg
*Attorney, Agent, or Firm*—Geoffrey H. Krauss; Joseph T. Cohen; Marvin Snyder

[57] ABSTRACT

An MOS voltage reference includes four MOS transistors connected in feedback circuit relationship, with the ratio of device width to length being essentially the same in the first two devices in order to provide an output voltage which is substantially constant over a range of input voltages and of temperatures.

16 Claims, 15 Drawing Figures

METAL-OXIDE-SEMICONDUCTOR VOLTAGE REFERENCE

This invention relates, in general, to semiconductor voltage reference devices and, more particularly, to an integratable metal-oxide-semiconductor (MOS) voltage reference for incorporation in an integrated circuit device.

It is often desirable to provide a voltage reference source for use with an MOS integrated circuit. In the past, it has been the practice to provide an external voltage reference, for example a Zener or reference diode or standard voltage cell or the like, separate from the MOS circuit. It is advantageous both to reduce the complexity of a device and also to reduce the cost thereof, to include as many of the components required to perform a specific function as possible in a single integrated circuit device. Heretofore, the inclusion of a voltage reference on a semiconductor device fabricated in accordance with MOS technology has not been satisfactorily demonstrated.

Accordingly, it is an object of this invention to provide a solid state voltage reference including only components which are susceptible to being fabricated in MOS form.

It is a further object of this invention to provide a voltage reference having a high degree of stability despite changes in supply voltage and/or temperature.

It is a further object of this invention to provide a semiconductor voltage reference which is easy to fabricate and which does not utilize a large amount of semiconductor area.

Briefly stated and in accordance with one aspect of this invention, an integratable semiconductor voltage reference includes first, second, third and fourth MOS transistors connected in feedback circuit relationship. A unique operating point is determined by selection of the width-to-length ratios of the first and second transistors. When the width-to-length ratio of the first transistor is essentially equal to the width-to-length ratio of the second transistor, substantial temperature independence of the output voltage of the circuit is obtained.

In accordance with a presently preferred embodiment of this invention, a first enhancement mode transistor, the source of which is connected to ground, is provided, a second transistor of the depletion type is provided having its drain connected to a source of supply voltage, and its gate and source connected together. The source of the second transistor is connected to the drain of the first, enhancement mode, transistor. A third, enhancement mode, transistor, has its gate connected to the gate of the second transistor, its drain connected to the source of supply voltage and its source connected to the output terminal of the voltage reference. A fourth, depletion mode, transistor is provided having its gate and source connected together and connected to ground, and its drain connected to the output terminal of the reference. The gate of the first, enhancement mode, transistor is further connected to the output terminal of the reference device.

While the presently preferred embodiment of this invention cooperatively utilizes both depletion and enhancement mode transistors, other embodiments in accordance with the teachings of this invention utilize all enhancement or all depletion mode transistors.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
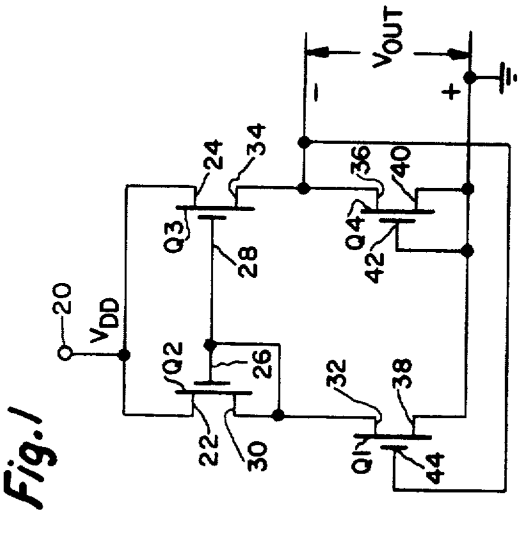
FIG. 1 is a schematic diagram of a voltage reference in accordance with a presently preferred embodiment of this invention.
Figure 7:
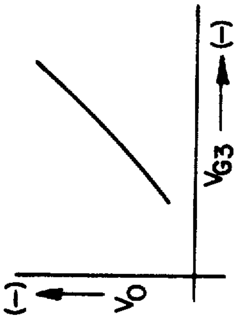
FIG. 7 is the transfer function of the portion of the circuit accented in FIG. 6.
Figure 10A:
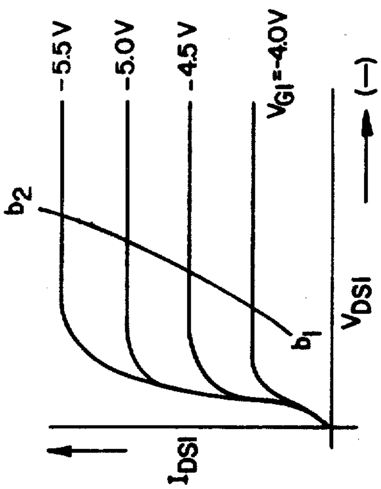

FIG. 10*a* is a composite graphical representation of the open loop operating characteristic of the combined accentuated portions of the circuits of FIG. 1 and FIG. 7 wherein the line $b_1$—$b_2$ is the locus of permissable operating points having $V_{G3}$ as the independent variable.

Figure 10B:
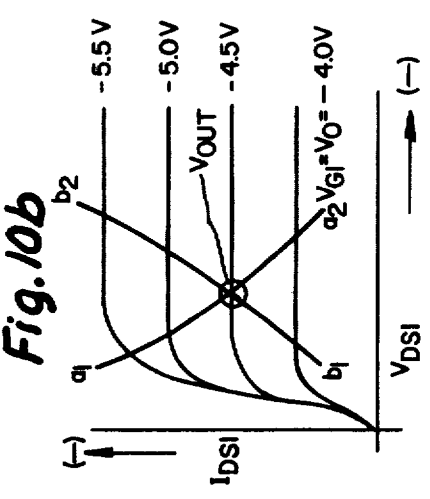

FIG. 10*b* is a composite graphical representation of the transfer function of the circuit of FIG. 1 wherein the intersection of the lines $a_1$—$a_2$ and $b_1$—$b_2$ uniquely defines the operating point of the voltage reference.

Figure 11:
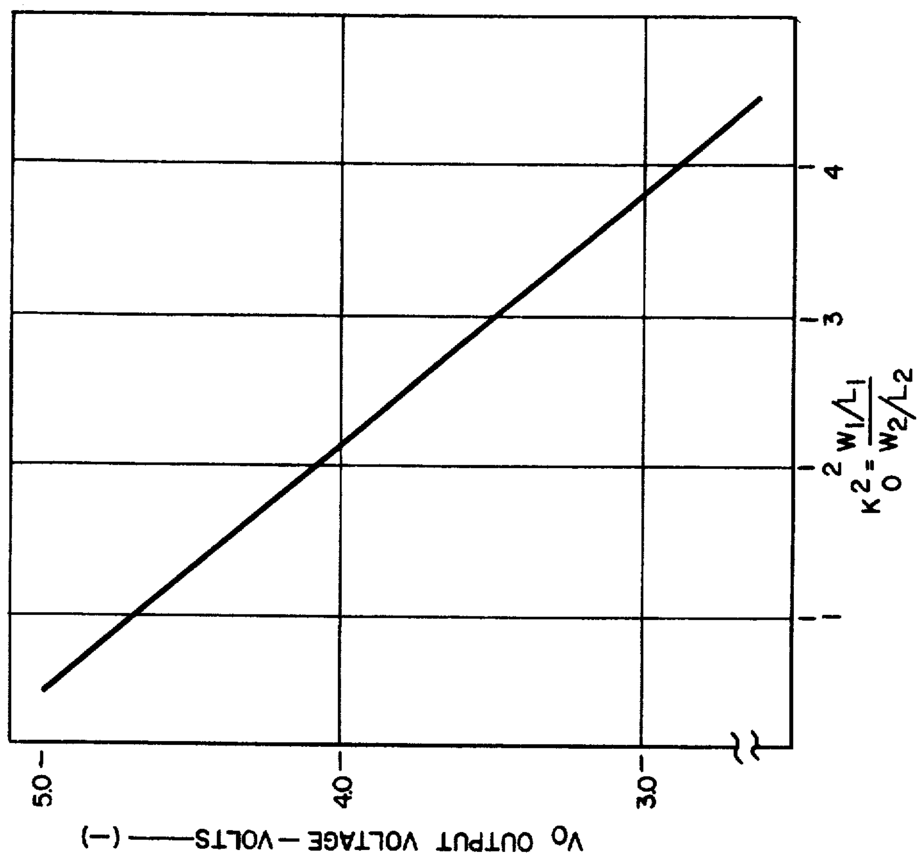

FIG. 11 is a graphical representation of the dependence of the output voltage of the circuit of FIG. 1 on the "geometry ratio", $K_0 = \sqrt{(W_1/L_1)/(W_2/L_2)}$, where W is the width and L the length of the conductance channels of transistor one and transistor two respectively according to designating subscript.

Figure 12:
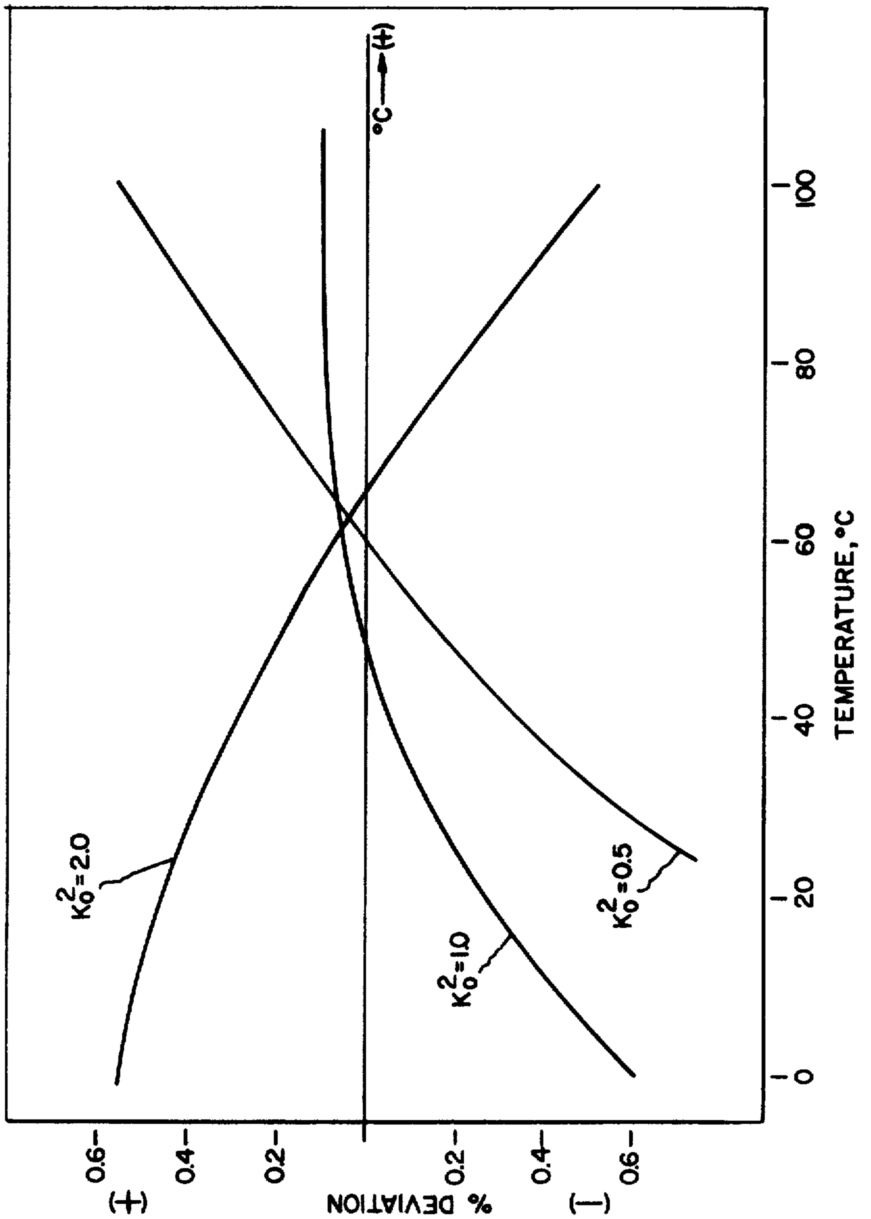

FIG. 12 is a graphical representation of a typical measured variation of the output voltage of a voltage reference as a function of temperature in accordance with this invention and also illustrates the resultant changes caused by variations of the "geometry ratio".

Figure 13:
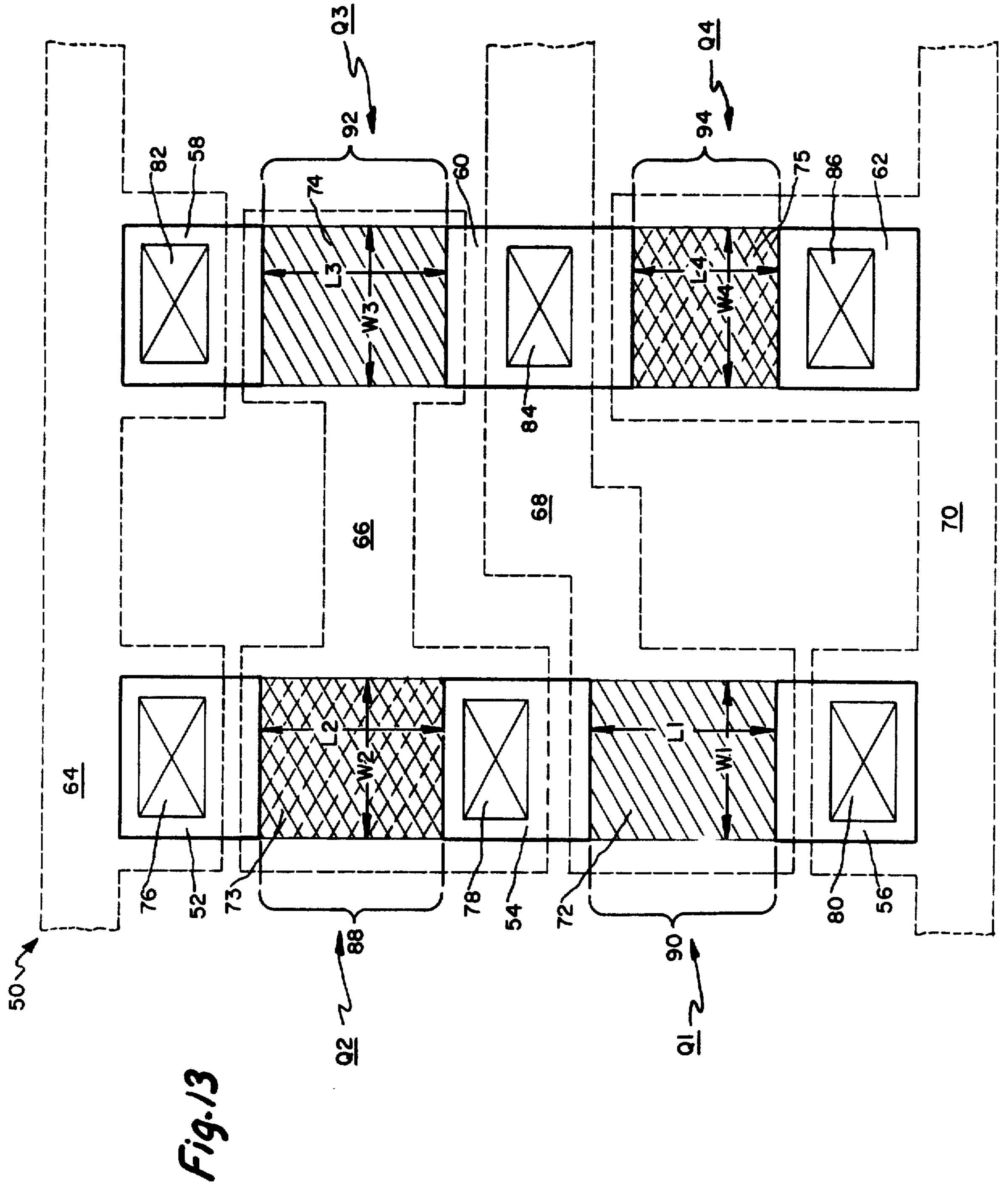
Figure 14:
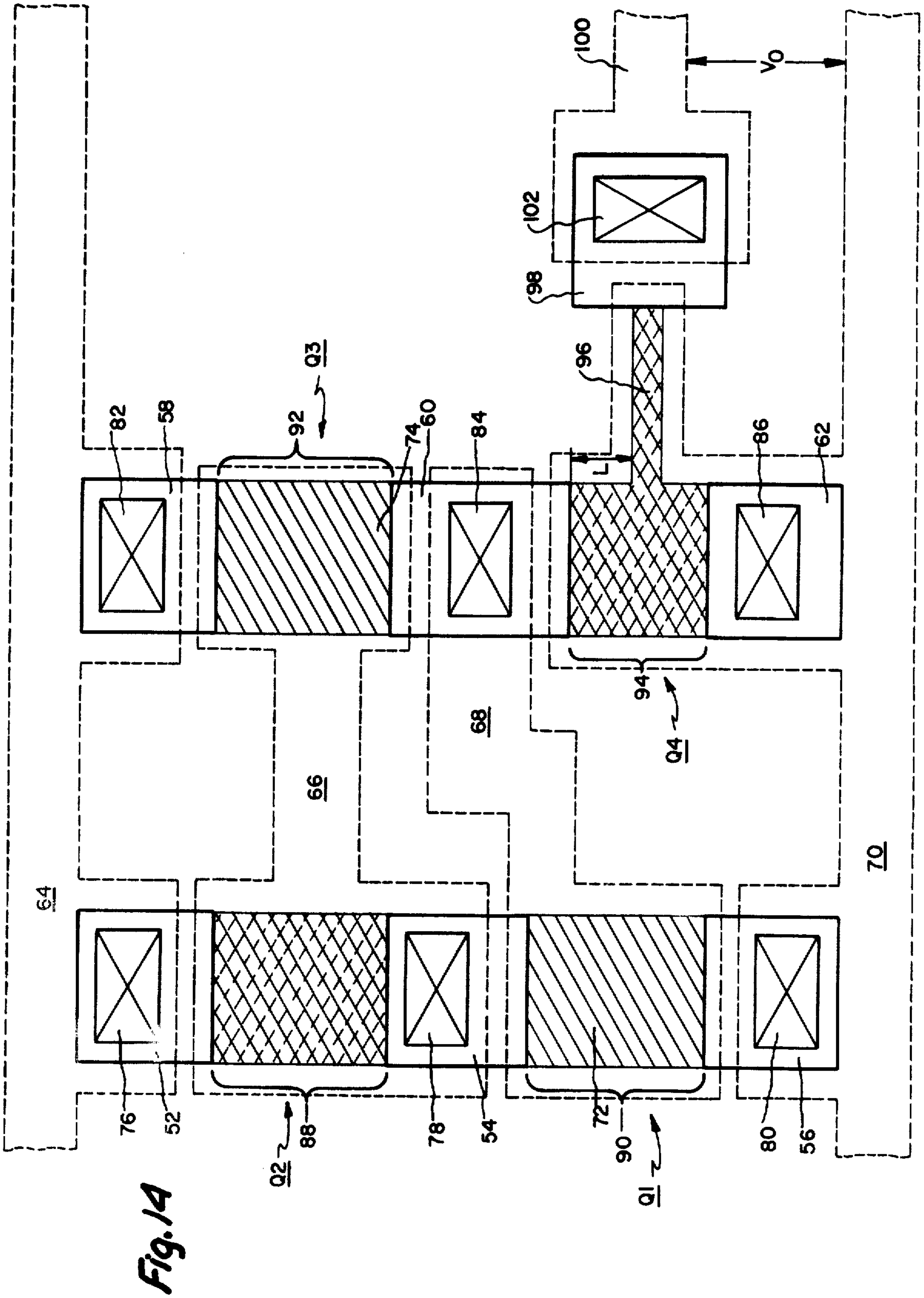

FIGS. 13 and 14 are views of exemplary structures for implementing a voltage reference in accordance with this invention.

A schematic diagram of a voltage reference in accordance with a presently preferred embodiment of this invention is illustrated at FIG. 1. While the circuit of FIG. 1 is especially suited to be implemented in p-channel MOS form, the invention itself is not so limited and may be implemented in n-channel form as will be described. Terminal 20 is adapted to be connected to a source of negative supply voltage. The circuit includes four transistors, Q1, Q2, Q3 and Q4. Transistors Q1 and Q3 are preferably enhancement mode, MOS transistors; while transistors Q2 and Q4 are preferably depletion mode MOS transistors. Transistors Q2 and Q4 might readily be formed, for example, by ion implantation.

Drain electrodes 22 and 24 of transistors Q2 and Q3, respectively, are connected to the negative supply voltage at terminal 20. Gate electrodes 26 and 28 of transistors Q2 and Q3, respectively, are connected together and are, in turn, connected to source electrode 30 of transistor Q2. Source electrode 30 of transistor Q2 is connected to drain electrode 32 of transistor Q1 while source electrode 34 of transistor Q3 is connected to drain electrode 36 of transistor Q4. The source electrodes 38 and 40 of transistors Q1 and Q4, respectively, are connected to ground. Gate electrode 42 of transistor Q4 is preferably connected to ground while gate electrode 44 of transistor Q1 is connected to the junction of source electrode 34 and drain electrode 36 of transistors Q3 and Q4, respectively. The output voltage of the circuit is obtained between drain and source electrodes 36 and 40, respectively, of transistors Q4 and is designated $V_O$ having its negative polarity terminal at drain electrode 36 of transistor Q4 and its positive polarity terminal at source electrode 40 as indicated in FIG. 1.

The operation of the circuit of FIG. 1 may most readily be understood by considering several portions thereof independently and then by combining them. Accordingly, FIG. 2 duplicates the circuit of FIG. 1 while illustrating a portion thereof in a heavier line weight than the remainder of FIG. 2. The heavyweight lines in FIG. 2 include transistor Q1.

Figure 2:
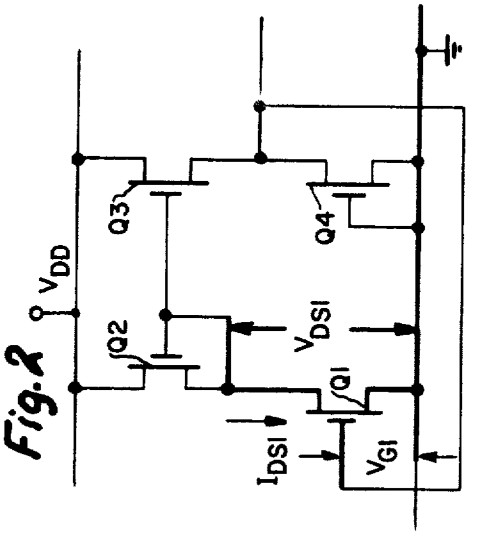
FIG. 2 is another schematic diagram of the voltage reference of FIG. 1 wherein a portion of the circuit is accented for purpose of analysis.
Figure 3:
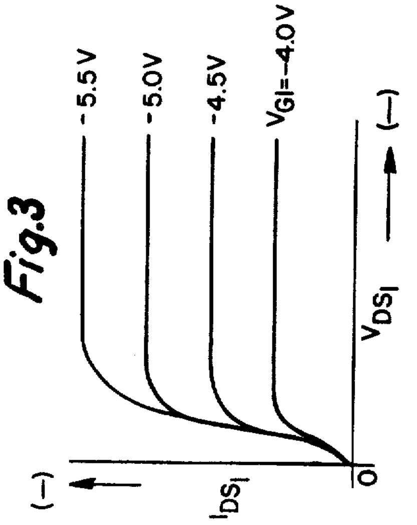
FIG. 3 is a graphical representation of the transfer function of the portion of the circuit accented in FIG. 2.

FIG. 3 illustrates in graphical form the transfer function of the heavy lined portion of FIG. 2. The drain-source voltage $V_{DS1}$ is plotted as a function of the drain source current $I_{DS1}$ and the gate voltage $V_{G1}$. The family of curves illustrated in FIG. 3 will be appreciated to conform to the relationship $$I_{DS1} = -K\ W_1/L_1\,(V_{G1} - V_{TH1})^2$$

which is the transfer function for an enhancement mode MOS transistor. $I_{DS1}$ is the drain source current, $K$ is the gain factor, $W_1$ and $L_1$ are the channel width and length dimensions, respectively, of the Q1 transistor, $V_{G1}$ is the gate voltage and $V_{TH1}$ is the threshold voltage of the device. Those skilled in the art will recognize that the foregoing equation, as well as those to follow, is general in form rather than exact, and does not attempt to include low order effects.

Figure 4:
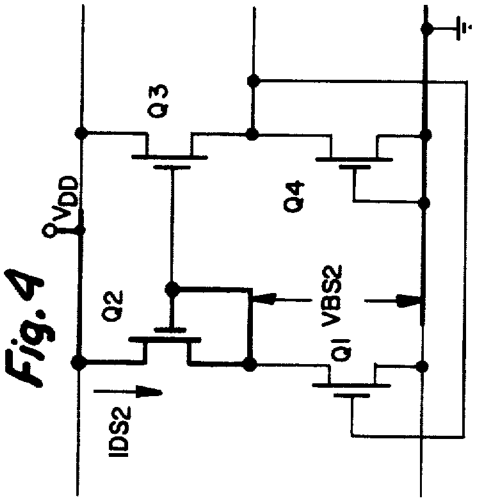
FIG. 4 is a schematic diagram of the circuit of FIG. 1 wherein another portion of the circuit is accented.

In FIG. 4 a second portion of the circuit of FIG. 1 is illustrated in a heavier line weight.

Figure 5:
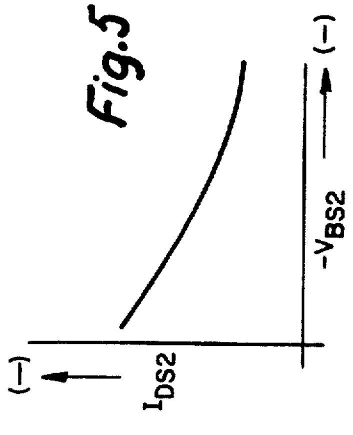
FIG. 5 is a graphical representation of the transfer function of the portion of the circuit accented in FIG. 4.

FIG. 5 is a graphical representation of the transfer function of that portion of that circuit of FIG. 1 which is emphasized in FIG. 4. The heavy line weight portion of FIG. 4 includes depletion mode transistor Q2 having the gate thereof connected to the source. The two parameters illustrated are the drain source current $I_{DS2}$ and the source to substrate voltage $V_{BS2}$. $I_{DS2}$ is dependent upon several parameters, the most significant of which are: gain factor; threshold voltage; magnitude of activated ions implanted in silicon, depth of ion implant peak and range of implant; thickness of thin oxide; bulk effect voltage bias and bulk impurity concentration. A nominal selection of materials and processing parameters yields a typical p-channel depletion device effective threshold voltage at $-4.5$ v extrapolated to $I_{DS} = 0$.

In an exemplary p-channel embodiment of this invention the following are nominal device parameters; bulk 4–2 ohm-cm, <111> orientation; p-diffusion, 110 ohm per square, lateral diffusion 2.5$\mu$; thin $SiO_2$ gate oxide, 1200 A; enhancement type boron ion implant, $2.5 \times 10^{11}/cm^2$ at 50 Kev.; depletion type boron ion implant, $2.5 \times 10^{11}/cm^2$ plus $1.3 \times 10^{12}/cm^2$ both at 50 Kev; all implants thru 1200 A gate oxide, lead to a depletion device with equivalent gate voltage of $-4.5$ V. and enhancement device threshold voltage of $-1.6$ V. via extrapolation to $I_{DS} = 0$ on plot of $I_{DS}$ vs. $V_{GS}$. Variations in the foregoing lead to variations in the characteristics of the depletion mode devices especially in the threshold voltage thereof which produce different output voltage for a reference circuit in accordance with this invention.

Figure 6:
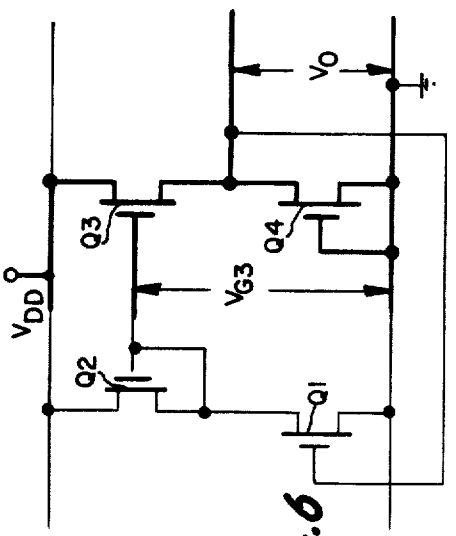
FIG. 6 is a schematic diagram of the circuit of FIG. 1 wherein yet another portion is accented for purposes of analysis.

FIG. 6 is a schematic diagram of the circuit of FIG. 1 wherein a third portion of the circuit is emphasized in a heavy line weight. The portion of the circuit emphasized in FIG. 6 includes transistors Q3 and Q4 as well as the interconnection therebetween.

FIG. 7 is a graphical representation of the transfer function showing the relationship between voltage $V_{G3}$ and the output voltage $V_0$ of the device. This relation may be expressed as $$V_0 = K_3 V_{G3}$$

wherein $K_3$ is the proportionality constant in the linear region of operation for the combination of transistors $Q_3$ and $Q_4$, $V_{G3}$ is the Q3 gate voltage as indicated at FIG. 6 and $V_0$ is the output voltage.

Figure 8:
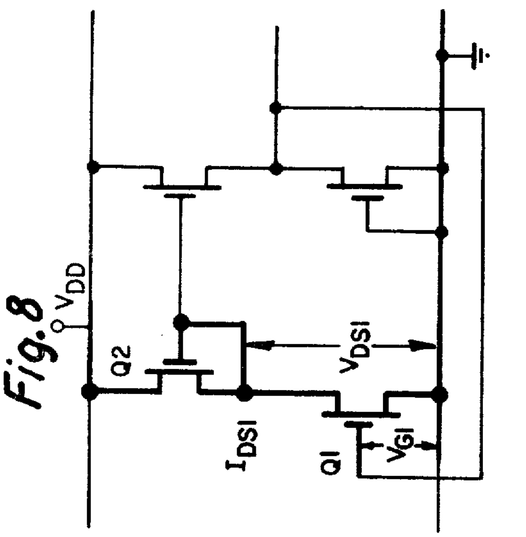
FIG. 8 is a schematic diagram of the circuit of FIG. 1 wherein both the portions of the circuits accented in FIGS. 2 and 4 are simultaneously accented.
Figure 9:
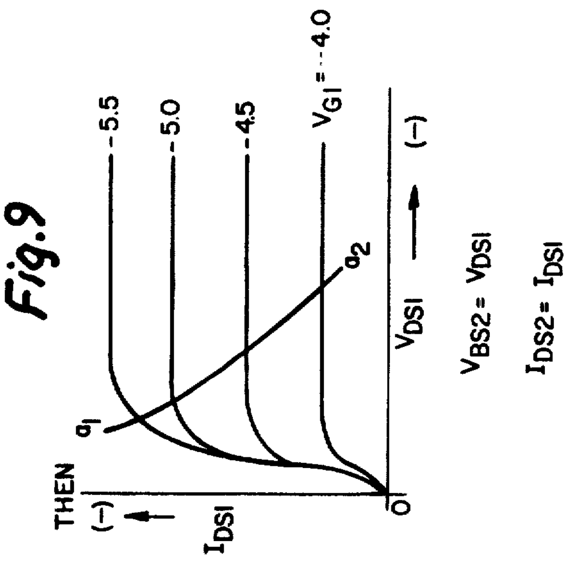
FIG. 9 is a composite graphical representation of the open loop transfer function of the accented portions of the circuit of FIG. 8, wherein the line $a_1$—$a_2$ is the locus of permissable operating points having $V_{G1}$ as the independent variable.

FIG. 8 is a schematic diagram of the circuit of FIG. 1 wherein both those portions illustrated in heavy line weights in FIGS. 2 and 4 are similarly represented. Thus, transistors Q1 and Q2 in combination provide the transfer function illustrated graphically at FIG. 9. The operating point of the combination of transistors Q1 and Q2 must necessarily fall on a point which is on the transfer functions of each. FIG. 9 is a graphical representation wherein the two transfer functions of the devices are superimposed. It will be noted that $I_{DS2} = I_{DS1}$, and further that $-V_{BS2} = V_{DS1}$. Therefore, the two graphs may be plotted on the same axes.

FIG. 10*a* is a composite graphical representation of the open loop transfer function of the accentuated portions of the circuits of FIG. 1 illustrated in FIGS. 2 and 6. Line $b_1$—$b_2$ is the locus of permissible operating points with $V_{G3}$ as the independent variable. Not that $V_0 = V_{G1}$.

Referring now to FIG. 10*b*, the transfer function associated with transistors Q3 and Q4 is added to the graph of FIG. 9 to produce a graph wherein the transfer functions of the component parts of the circuit of FIG. 1 is depicted. It will be recognized by referring to FIGS. 1 and 6 that $V_{G3} = -V_{BS2} = V_{DS1}$ and further that $V_0 = V_{G1}$. Accordingly, an operating point is determined as illustrated in FIG. 10 which uniquely satisfies the component elements of the circuit as interconnected in FIG. 1. FIG. 11 illustrates graphically the relationship between output voltage and geometry ratios. It will be seen that while a fairly wide range of output voltages is attainable, that a particular output voltage is attained at the most temperature stable configuration of the device which voltage is between 4 and 5 volts as shown. It will be appreciated by those skilled in the art that where a temperature coefficient other than zero is desired or tolerable, that an output voltage may be selected, with a corresponding change in temperature coefficient; or that a temperature coefficient may be selected with a corresponding change in output voltage. In many applications to which this invention is addressed, it is sufficient to provide a voltage reference having a stable output voltage whose value is more or less arbitrary. In other applications, however, a particular voltage may be required along with a somewhat greater tolerance for temperature related voltage dependence. In still other applications, a more or less arbitrary voltage may be acceptable along with a particular temperature coefficient either positive or negative. Each of these cases may readily be provided in accordance with the teachings of this invention.

FIG. 12 illustrates the sensitivity of the reference output voltage to temperature variations with device ratios as a parameter. The percent of deviation for each point on a given line is referenced to the mean value for all points on the line. It will be appreciated by reference to FIG. 12 that the best temperature stability is established where the geometry ratio $K_0 = \sqrt{(W_1/L_1)/(W_2/L_2)}$ is essentially equal to 1.0. The geometry ratio also affects the output voltage of a reference in accordance with this invention.

An exemplary semiconductor structure for providing an MOS voltage reference in accordance with the teachings of this invention is illustrated at FIG. 13. The device generally designated 50 includes impurity regions 52, 54, 56, 58, 60 and 62 which may be formed in conventional fashion as, for example, by diffusion from the surface of the substrate down into the bulk thereof. Four MOS transistors are formed by the diffusions in conjunction with electrodes 64, 66, 68 and 70. The electrodes are spaced apart from the impurity regions by an oxide layer which is not generally illustrated and which includes thick and thin portions, the thin portions in accordance with the teachings of this device being illustrated at 72, 73, 74 and 75. Contact holes 76, 78, 80, 82, 84 and 86 provide ohmic contact between electrodes 64, 66, 68 and 70 and the various impurity regions as illustrated. Transistor Q2 is formed by impurity regions 52 and 54, electrodes 64 and 66 and channel 88 located between impurity regions 52 and 54. Channel 88 is preferably an ion implanted region to form depletion mode MOS transistor. Transistor Q1 is formed by impurity regions 54 and 56, electrodes 66, 68 and 70, and channel 90 located between the impurity regions 54 and 56. In accordance with a preferred embodiment of this invention, channel 90 may be a slightly ion implanted region forming a low threshold enhancement mode MOS device. Transistor Q3 is formed by impurity regions 58 and 60 along with the associated electrodes 64, 66 and 68 and channel 92 located between the two impurity regions. Channel 92 is treated as 90 is, forming an enhancement mode MOS device. Transistor Q4 is formed by impurity regions 60 and 62, electrodes 68 and 70 and by a depletion ion implanted channel 94. Those skilled in the art will appreciate, by reference to FIG. 13 along with the schematic diagram of FIG. 1 that the circuit of FIG. 1 is readily implemented in the form of device 50. As was hereinabove discussed, the temperature dependence and output voltage of an integratable MOS voltage reference in accordance with this invention depend upon the relative dimensions of the several transistors comprising the structure along with the degree of ion implantation of the depletion mode transistor Q1. The widths and lengths which determine the operating characteristics of a device in accordance herewith are also illustrated at FIG. 13.

In accordance with another aspect of this invention, FIG. 14 illustrates an alternative embodiment of a voltage reference according to the teachings hereof wherein an output voltage is provided which is variable without substantially changing the relative temperature dependence thereof. The structure of FIG. 14 is substantially identical to that of FIG. 13 except for the particular arrangement of transistor Q4 which in the case of the device of FIG. 14 is provided with a tap in the drain-source channel thereof, the position of which is variable in order to particularly determine a desired output voltage. Accordingly, like elements in FIG. 14 with respect to those in FIG. 13 are designated with like reference numerals. Referring specifically to that portion of the structure of FIG. 14 which comprises transistor Q4, channel 94 is provided with an extension 96 thereof which is located as defined by distance L a certain distance from the drain region of transistor Q4 which in the case of device of FIG. 14 is region 60. Extension 96 extends to semiconductor region 98 which is a region similar to regions 52, 54, 56, 58, 60 and 62 and may readily be formed at the same time thereas by similar processes. Output electrode 100 contacts region 98 through contact hole 102. The output voltage of the device of FIG. 14 is derived between electrodes 100 and 70. The magnitude of output voltage $V_0$ may be varied by varying the position of tap 96, that is to say by changing the magnitude of distance L. The closer tap 96 is to region 62, which will be recalled to be at ground potential, the lower the output voltage. In accordance with the embodiment of this invention illustrated at FIG. 14, the output voltage may be changed without affecting the insensitivity of the reference to temperature and input voltage changes. It will, of course, be appreciated that to some extent, a degree of temperature dependence is introduced by the addition of tap 96 insofar as a portion of channel 94 which is to some extent a temperature sensitive resistance is effectively connected in series with the output. This rather limited temperature dependence is readily compensated for and is felt to be acceptable in view of the increased versatility attendent the use of tap 96.

While embodiments of this invention have been described for illustrious purposes which are formed in p-channel MOS technology, n-channel technology is equally appropriately used in accordance with this invention. Where an N-MOS device is utilized, it may be necessary to form, for example, enhancement mode devices by ion implantation of boron in a manner dicated by gate electrode to chip substrate work function considerations. To form depletion mode devices, it is appropriate to form regions by the ion implantation of phosphorous in accordance with the same work functions.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A voltage reference circuit including essentially only metal-oxide-semiconductor (MOS) transistors comprising:

a first MOS transistor having gate, source and drain electrodes;

a second MOS transistor having gate, source and drain electrodes, the gate and source electrodes of said second MOS transistor connected together and further connected to said drain of said first MOS transistor;

a third MOS transistor having gate, source and drain electrodes, said gate electrode of said third MOS transistor connected to said gate and source of said second MOS transistor and said drain electrode connected to said drain electrode of said second MOS transistor and said source electrode connected to said gate electrode of said first MOS transistor;

a fourth MOS transistor having gate source and drain electrodes, said gate and source electrodes connected to said source electrode of said first MOS transistor and said drain electrode connected to said source electrode of said third MOS transistor;

said first and second MOS transistors characterized by first and second device channel width to length ratios which are essentially equal.

2. The voltage reference circuit of claim 1 wherein said second and fourth MOS transistors comprise depletion mode MOS transistors and said first and third transistors are enhancement mode transistors.

3. The voltage reference circuit of claim 1 wherein said first, second, third and fourth MOS transistors comprise enhancement mode MOS transistors.

4. The voltage reference circuit of claim 1 wherein said first, second, third and fourth MOS transistors each comprise depletion mode MOS transistors.

5. The voltage reference circuit of claim 2 wherein said depletion mode MOS transistors comprise ion implanted depletion mode MOS transistors.

6. The voltage reference circuit of claim 1 wherein said fourth MOS transistor comprises a tapped MOS transistor for providing a selectable output voltage.

7. The device of claim 6 wherein said second and fourth MOS transistors are depletion mode transistors and said first and third transistors are enhancement mode transistors.

8. The device of claim 6 wherein each of said first, second, third and fourth transistors are enhancement mode transistors.

9. The device of claim 6 wherein each of said first, second, third and fourth transistors are depletion mode transistors.

10. The device of claim 7 wherein said depletion mode transistors comprise ion implanted depletion mode transistors.

11. A voltage reference circuit including essentially only metal-oxide-semiconductor (MOS) transistors comprising:

a substantially unregulated voltage source;

first and second MOS transistors, each including gate, source and drain electrodes, connected in series circuit relationship across said voltage source, said second MOS transistor having its gate and source electrodes connected together;

third and fourth MOS transistors, each including gate, source and drain electrodes connected in series circuit relationship and connected in parallel with said first and second MOS transistors, said fourth MOS having its gate and source electrodes connected together;

the junction of said first and second MOS transistors being connected to the gate of said third MOS transistor and the junction of said third and fourth MOS transistors being connected to the gate electrode of said first MOS transistor;

the ratio of the geometry ratius of said first and second MOS transistors being selected to provide an output voltage at the juncture of said third and fourth MOS transistors which is essentially constant.

12. The voltage reference circuit of claim 11 wherein said ratio of said geometry ratios is essentially 1 to 1.

13. The voltage reference circuit of claim 11 wherein said second and fourth MOS transistors comprise depletion mode transistors.

14. The voltage reference circuit of claim 13 wherein said second and fourth MOS transistors comprise ion implanted depletion mode transistors.

15. The voltage reference circuit of claim 14 wherein said first and third transistors comprise enhancement mode field effect transistors.

16. The voltage reference circuit of claim 15 wherein said fourth MOS transistor is a tapped MOS transistor.

* * * * *